United States Patent
Anabuki et al.

(10) Patent No.: US 6,506,828 B1
(45) Date of Patent: Jan. 14, 2003

(54) RESIN COMPOSITION, MOLDED ARTICLE THEREFROM, AND UTILIZATION THEREOF

(75) Inventors: Hitoshi Anabuki, Sakaide (JP); Machiko Yokozeki, Sakaide (JP)

(73) Assignee: Kyowa Chemical Industry Co., Ltd., Kagawa (JP)

( * ) Notice: Subject to any disclaimer, the term of this patent is extended or adjusted under 35 U.S.C. 154(b) by 0 days.

(21) Appl. No.: 09/889,694

(22) PCT Filed: Nov. 21, 2000

(86) PCT No.: PCT/JP00/08207

§ 371 (c)(1),
(2), (4) Date: Jul. 20, 2001

(87) PCT Pub. No.: WO01/38442

PCT Pub. Date: May 31, 2001

(30) Foreign Application Priority Data

Nov. 22, 1999 (JP) ............................. 11-331414
Dec. 14, 1999 (JP) ............................. 11-354346

(51) Int. Cl.⁷ ................................ C08K 3/22
(52) U.S. Cl. ................ 524/433; 524/779; 523/440; 523/457; 106/18.26; 106/461; 423/635; 423/274; 428/403; 428/447; 428/413; 428/330
(58) Field of Search ............... 524/433, 779; 523/440, 457; 428/403, 447, 413, 330; 423/274, 635; 106/18.26, 461

(56) References Cited

U.S. PATENT DOCUMENTS

| 4,154,718 A |   | 5/1979 | Miyata et al. | ............ 260/42.14 |
| 5,039,509 A | * | 8/1991 | Miyata et al. | .............. 106/461 |
| 5,286,285 A | * | 2/1994 | Meier et al.  | ............ 106/18.11 |
| 5,298,328 A |   | 3/1994 | Abe et al.    | ................. 428/403 |
| 5,424,352 A |   | 6/1995 | Watanabe      |                         |
| 6,214,313 B1 | * | 4/2001 | Berisko et al. | ........ 423/243.08 |
| 6,338,898 B1 | * | 1/2002 | Miyahara et al. | ........... 428/328 |

FOREIGN PATENT DOCUMENTS

| EP | 0-384603 A1 | 8/1990 | ............. C01F/5/22 |
| EP | 0 666 238   | 8/1994 |                        |
| EP | 0780425 A1  | 6/1997 | ............. C08K/3/22 |
| EP | 0 827 159   | 8/1997 |                        |
| JP | 55-013726   | 1/1980 | ............. C08K/3/22 |
| JP | 02-266539   | 4/1989 |                        |
| JP | 03-062845   | 3/1991 |                        |
| JP | 03-505863   | 12/1991 |                       |
| JP | 06-171928   | 6/1994 |                        |
| WO | WO95/06085  | 3/1995 |                        |

OTHER PUBLICATIONS

Abstract, JP 55–013726, Jan. 30, 1980.

* cited by examiner

Primary Examiner—Margaret G. Moore
(74) Attorney, Agent, or Firm—Sherman & Shalloway

(57) ABSTRACT

A resin composition which comprises 100 parts by weight of a synthetic resin and 50 to 1,500 parts by weight of magnesium oxide particles, wherein the magnesium oxide particles satisfy the following requirements (i) to (v):
(i) an average secondary particle diameter of 0.1 to 130 μm,
(ii) a BET method specific surface area of 0.1 to 5 $m^2/g$,
(iii) a total content of an Fe compound and an Mn compound of 0.01 wt % or less in terms of metals,
(iv) an Na content of 0.001 wt % or less, and
(v) a Cl content of 0.005 wt % or less,
and a molded product formed therefrom. Since the resin composition of the present invention has excellent flame retardancy, heat conductivity and water resistance, it is advantageously used as a material for sealing a heat generating electronic member such as a semiconductor.

21 Claims, No Drawings

RESIN COMPOSITION, MOLDED ARTICLE THEREFROM, AND UTILIZATION THEREOF

DETAILED DESCRIPTION OF THE INVENTION

1. Field of the Invention

The present invention relates to a resin composition, molded products formed therefrom and use thereof. Particularly, it relates to a resin composition having excellent flame retardancy, heat conductivity and water resistance, molded products formed therefrom and use thereof. More particularly, it relates to a resin composition which is suitable for use as a material for sealing a semiconductor and contains substantially no halogen.

2. Prior Art

Semiconductor elements and integrated circuit elements are sealed by sealing materials to protect them from external vibration, impact, dust, water, atmospheric gas and the like. Although metal materials, ceramics, glass and the like have been used as the sealing materials, plastic resins have recently been used in most cases from the viewpoints of cost and mass-productivity.

Epoxy resins, silicone resins, phenolic resins, diallyl phthalate resins and polyimide resins have been used as the sealing materials and obtained satisfactory results.

However, due to a tendency toward higher integration, smaller elements, finer wiring patterns with technical innovation in the filed of semiconductor, packages tend to be smaller and thinner, with result that higher reliability is required of sealing materials.

Further, electronic parts such as semiconductor devices need to be high flame retardant and brominated epoxy resin and antimony trioxide are contained in the sealing materials. However, when antimony trioxide is used, it causes environmental safety problems such as harmfulness to the human body and the corrosion of equipment by hydrogen bromide, bromine-based gas and antimony bromide generated at the time of combustion, industrial waste produced in the step of sealing semiconductor elements and the disposal of semiconductor devices after use.

Further, when a semiconductor device which contains the above flame retardant is left at high temperatures for a long time, an aluminum wiring on a semiconductor element is corroded by the influence of liberated bromine, causing a failure of the semiconductor device and reducing high-temperature reliability. To solve the above problems, there is proposed a method of adding metal hydroxide particles as a flame retardant.

However, as a large amount (40 wt % or more) of a metal hydroxide must be blended in this method, such a problem arises that semiconductor device swells or cracks by the quick vaporization of water absorbed by the metal hydroxide particles which have high water absorption when the semiconductor device is exposed to high temperatures (generally 215 to 260° C.), thereby reducing solder resistance.

The above method involves another problem that the function of a semiconductor element deteriorates under high temperature and high humidity such as at a temperature of 80 to 200° C. and a relative humidity of 70 to 100%.

JP-A 7-806085 (the term "JP-A" as used herein means an "unexamined Japanese patent application") proposes a thermosetting resin composition for sealing a semiconductor which comprises a thermosetting resin, curing agent, metal hydroxide particles and metal oxide particles. Higher flame retardancy, higher moisture resistance and higher safety are needed due to recent technical innovation made in the semiconductor field. Further, when the metal hydroxide particles and the metal oxide particles contain impurities in large quantities, they cause the corrosion of a mold and semiconductor element.

Problem to Be Solved by the Invention

It is therefore a first object of the present invention to provide a resin composition which has excellent flame retardancy, heat conductivity and water resistance and molded products formed therefrom.

It is a second object of the present invention to provide a flame retardant resin composition which is suitable for use as a material for sealing a semiconductor and contains substantially no halogen and molded products formed therefrom.

It is a third object of the present invention to provide a resin composition which has excellent heat conductivity that it can radiate heat from a heat generating electronic member and molded products formed therefrom.

Means for Solving the Problems

It has been found by studies conducted by the inventors of the present invention that the above objects of the present invention are attained by selecting magnesium oxide particles which have a specified secondary particle diameter and a specified BET method specific surface area, contain a Fe compound and an Mn compound in predetermined amounts or less and have extremely small contents of Na and Cl, as magnesium oxide particles to be composed into a synthetic resin.

That is, according to the present invention, there is provided a resin composition which comprises 100 parts by weight of a synthetic resin and 50 to 1,500 parts by weight of magnesium oxide particles, wherein the magnesium oxide particles satisfy the following requirements (i) to (v):
(i) an average secondary particle diameter of 0.1 to 130 $\mu$m,
(ii) a BET method specific surface area of 0.1 to 5 m$^2$/g,
(iii) a total content of an Fe compound and an Mn compound of 0.01 wt % or less in terms of metals,
(iv) an Na content of 0.001 wt % or less, and
(v) a Cl content of 0.005 wt % or less.

The present invention will be described in detail hereinafter.

The magnesium oxide particles used in the present invention satisfy the following requirements (i) to (v):
(i) an average secondary particle diameter of 0.1 to 130 $\mu$m, preferably 0.5 to 50 $\mu$m,
(ii) a BET method specific surface area of 0.1 to 5 m$^2$/g, preferably 0.1 to 3 m$^2$/g,
(iii) a total content of an Fe compound and an Mn compound of 0.01 wt % or less, preferably 0.005 wt % or less in terms of metals,
(iv) an Na content of 0.001 wt % or less, preferably 0.0005 wt % or less, and
(v) a Cl content of 0.005 wt % or less, preferably 0.002 wt % or less.

When the magnesium oxide particles have a large total content of an iron compound and a manganese compound, they reduce the thermal stability of the resin considerably. However, when only the total content of the iron compound and the manganese compound falls within the above range, deterioration in the physical properties of the resin cannot be prevented, and the above average secondary particle diameter and specific surface area must fall within the above ranges as well at the same time. As the average second particle diameter of the particles increases, the particles have a smaller contact area with the resin and higher thermal stability but reduced mechanical strength and occurred problems such as a poor appearance.

As described above, when the magnesium oxide particles satisfy the above requirements for average secondary particle diameter, specific surface area, the total content of an iron compound and a manganese compound, Na content and Cl content, there is obtained a resin composition which is satisfactory in terms of characteristic properties such as compatibility with a resin, dispersibility, moldability and workability, the appearance of a molded product, mechanical strength and flame retardancy.

The magnesium oxide particles may be produced by any conventional method. For example, magnesium oxide particles having high fluidity, high loading properties and high hydration resistance are obtained by the method disclosed by JP-A 6-171928, that is, by baking highly dispersible magnesium hydroxide at a predetermined temperature and grinding the baked product to a predetermined particle diameter without destroying the crystals of the baked product substantially and classifying the ground product. The magnesium oxide particles may be and preferably are spherical magnesium oxide particles obtained by granulating and drying a highly dispersible magnesium hydroxide slurry by spray drying and baking the obtained granules at a predetermined temperature.

To ensure that the Fe compound, Mn compound, Na and Cl contents of the magnesium oxide particles should fall within the above ranges, a high-purity Mg raw material and alkali raw material must be selected at the time of the synthesis and a corrosion-resistant reactor must be used.

As for the synthesis of the highly dispersible magnesium hydroxide used in the above method, 0.95 equivalent or less, particularly preferably 0.5 to 0.90 equivalent of an alkaline substance is mixed and reacted with 1 equivalent of a water-soluble magnesium salt at 40° C. or less, particularly preferably 30° C. or less and then the reaction product is heated under an increased pressure of about 5 to 30 kg/cm$^2$ together with a reaction mother liquor for about 0.5 to several hours to prepare the highly dispersible magnesium hydroxide.

When the magnesium oxide particles used in the present invention are mixed with the resin, the resulting product as higher fluidity and lower viscosity than other existing fillers and hence has excellent workability. When the magnesium oxide particles are mixed with the resin, the melt viscosity of the resulting composition can be reduced by expanding the range (particle size distribution) of particle diameter of the magnesium oxide particles within the above range of average particle diameter. Stated more specifically, it is advantageous that the magnesium oxide particles should have a particle size distribution that particles having a particle diameter of 10 μm or more account for 30 to 80 wt %, preferably 55 to 75 wt % and particles having a particle diameter of less than 10 μm account for 20 to 70 wt %, preferably 25 to 45 wt % of the total.

The magnesium oxide particles used in the present invention may be surface treated with at least one surface treating agent selected from the group consisting of a higher fatty acid, anionic surfactant, phosphate, coupling agent and fatty acid ester of a polyhydric alcohol.

Out of these surface treating agents, a phosphate is preferred and a phosphate represented by the following formula is particularly preferred.

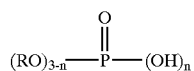

wherein n is 1 or 2, and R is an alkyl group having 4 to 30 carbon atoms or alkenyl group having 4 to 30 carbon atoms.

The phosphate may be a monoester, diester or mixture thereof. Preferably, the number of carbon atoms of the linear or branched alkyl group of one ester is 4 to 30. Examples of the phosphate include butyl acid phosphate, 2-ethylhexyl acid phosphate, lauryl acid phosphate, tridecyl acid phosphate, stearyl acid phosphate, di-2-ethylhexyl phosphate and oleyl acid phosphate. More preferably, the number of carbon atoms of the linear or branched alkyl group of one ester is 8 to 20. Stearyl acid phosphate is the most preferred.

To treat the surface of each magnesium oxide particle with the above surface treating agent, a method in which the magnesium oxide particle and the surface treating agent are directly heated, a method in which the surface treating agent dissolved in an organic solvent is directly sprayed over or mixed with the magnesium oxide particle and the organic solvent is then volatilized to be removed or a method in which the surface treating agent dissolved in an organic solvent is added to and mixed with a magnesium oxide slurry suspended in an organic solvent and then the organic solvents are separated and volatilized to be removed may be employed. The above surface treating agent may be added when the synthetic resin and the magnesium oxide particle are kneaded together.

The amount of the surface treating agent is 0.01 to 10.00 wt %, preferably 0.05 to 5.00 wt % based on the magnesium oxide particle.

The synthetic resin is an epoxy resin, silicone resin, phenolic resin, diallyl phthalate resin, polyimide resin, polyphenylene sulfide resin, acrylic rubber, butyl rubber, ethylene propylene rubber, ethylene-vinyl acetate copolymer or ethylene-acrylate copolymer. Out of these, an epoxy resin and silicone resin are preferred.

Examples of the epoxy resin include biphenyl type epoxy resins having a biphenyl skeleton such as 4,4'-bis(2,3-epoxypropoxy)biphenyl, 4,4'-bis(2,3-epoxypropoxy)-3,3',5,5'-tetramethylbiphenyl, 4,4'-bis(2,3-epoxypropoxy)-3,3',5,5'-tetraethylbiphenyl and 4,4'-bis(2,3-epoxypropoxy)-3,3',5,5'-tetramethyl-2-chlor obiphenyl; naphthalene type epoxy resins such as 1,5-di(2,3-epoxypropoxy)naphthalene and 1,6-di(2,3-epoxypropoxy)naphthalene; stilbene type epoxy resins such as 4,4'-bis(2,3-epoxypropoxy)stilbene and 4,4'-bis(2,3-epoxypropoxy)-3,3',5,5'-tetramethylstilbene; novolak type epoxy resins such as cresol novolak type epoxy resins, phenol novolak type epoxy resins and novolak type epoxy resins having a bisphenol A skeleton; arylaralkyl type epoxy resins such as phenol aralkyl type epoxy resins and naphthol aralkyl type epoxy resins; and polyfunctional epoxy resins such as dicyclopentadiene skeleton-containing epoxy resins and tris(2,3-epoxypropoxy)phenylmethane. Out of these, bifunctional epoxy resins such as biphenyl type epoxy resins, naphthalene type epoxy resins and stilbene type epoxy resins are particularly preferred. These epoxy resins are preferably cured by using a curing agent which will be described hereinafter.

An example of the silicone resin is a composition which comprises polyorganosiloxane and a curing agent. This polyorganosiloxane composition is obtained by uniformly dispersing (a) a polyorganosiloxane-based polymer and (b) a curing agent and optionally additives. Out of the components used in the composition, the poly organosiloxane-based polymer (a) and the curing agent (b) are suitably selected according to a reaction mechanism to obtain a rubber elastic material. As the reaction mechanism are known (1) crosslinking using an organic peroxide vulcanizing agent, (2) a condensation reaction, and (3) an addition reaction, and it is known that a preferred combination of a curing catalyst as the component (a) and a crosslinking agent as the component (b) is determined by the reaction mechanism.

The organic group in the polyorganosiloxane as the base polymer component (a) used in the various reaction mechanisms is a monovalent substituted or nonsubstituted hydrocarbon group. Examples of the nonsubstituted hydrocarbon group include alkyl groups such as methyl, ethyl, propyl, butyl, hexyl and dodecyl, aryl groups such as phenyl, and aralkyl groups such as β-phenylethyl and β-phenylpropyl, and examples of the substituted hydrocarbon group include a chloromethyl group and 3,3,3-trifluoropropyl group. Out of the silicone resins, silicone rubber is preferred.

As for the ratio of the synthetic resin to the magnesium oxide particles in the resin composition of the present invention, the magnesium oxide particles are used in an amount of 50 to 1,500 parts by weight, preferably 70 to 1,000 parts by weight, particularly preferably 90 to 800 parts by weight based on 100 parts by weight of the synthetic resin.

A curing agent, natural wax, synthetic wax, higher fatty acid and metal salt thereof, release agent such as paraffin and colorant such as carbon black may be added to the resin composition of the present invention as required. A flame retardant such as antimony trioxide, phosphorus compound or brominated epoxy resin may be added supplementarily as required.

To reduce stress, an elastomer may be added or reacted. The elastomer is an addition or reaction type elastomer such as polybutadiene, butadiene-acrylonitrile copolymer, silicone rubber or silicone oil.

Preferably, the resin composition of the present invention is produced by mixing together the above components by melt kneading with a known kneading means such as a kneader, roll single-screw or double-screw extruder or co-kneader.

The resin composition of the present invention is provided in the form of a powder or tablet. For example, to mold a member having a semiconductor fixed on a substrate from the resin composition, low-pressure transfer molding is generally used but injection molding and compression molding may also be used. As for molding conditions, the resin composition is molded at a temperature of 150 to 200° C. and a pressure of 5 to 15 MPa for a time of 30 to 300 seconds to produce a cured product of the resin composition, thereby producing a sealed semiconductor element. The above element may be additionally heated at 100 to 200° C. for 2 to 15 hours as required.

Any compound may be used as the curing agent used to cure the resin composition of the present invention if it reacts with the resin. However, the compound is preferably a phenolic compound having a hydroxyl group in the molecule as a compound having low water absorption when it is cured. Examples of the phenolic compound include a phenol novolak resin, cresol novolak resin, naphthol novolak resin, tris(hydroxyphenyl)methane, 1,1,2-tris(hydroxyphenyl)ethane, 1,1,3-tris(hydroxyphenyl)propane, condensation compound of terpene and phenol, dicyclopentadiene modified phenolicresin, phenol aralkyl resin, naphthol aralkyl resin, catechol, resorcin, hydroquinone, pyrogallol and phloroglucinol. Out of these, curing agents having a hydroxyl equivalent of 130 or more are preferred and phenol aralkyl resin and terpene skeleton-containing phenolic resin are particularly preferred. The amount of the curing agent is 50 to 200 parts by weight, preferably 70 to 150 parts by weight based on 100 parts by weight of the synthetic resin.

Since a molded product formed from the resin composition of the present invention contains magnesium oxide particles in a large proportion, it has excellent flame retardancy and satisfies level V-0 according to an UL 94 VE flame retardancy test. Since this molded product contains substantially no halogen, the corrosion of a metal and mold caused by halogen does not occur. Molded products from the resin composition have a water absorption of 0.07 to 0.6 wt % and a heat conductivity of 0.35 to 3.2 W/mK.

The molded product of the present invention has higher heat conductivity as the proportion of the magnesium oxide particles increases. Therefore, when the molded product is used as a material for sealing a heat generating electronic member such as a semiconductor, generated heat is effectively radiated from the molded product. Consequently, even when the molded product of the present invention is formed as a sheet and a heat generating electronic member is placed upon the sheet, heat can be effectively removed.

Also when the molded product is arranged to surround a heat generating electronic member, generated heat can be effectively removed.

The molded product of the present invention has extremely excellent water resistance because the shape of each magnesium oxide particle (particle diameter, specific surface area) is specified, the contents of impurity metals (Fe, Mn and Na) are small and the content of chlorine is small.

EXAMPLES

"%" and "parts" in the following examples mean "wt %" and "parts by weight", respectively, unless otherwise stated.

In the examples, the characteristic properties of the magnesium oxide particles and the physical properties of the molded product were measured in accordance with the following methods.

(1) Average Secondary Particle Diameter of Magnesium Oxide Particles

This was measured by using the SPA Type MICROTRAC particle size analyzer of LEEDS & NORTHRUP INSTRUMENTS CO., LTD.

700 mg of a powder sample was added to 70 ml of water and dispersed ultrasonically (MODEL US-300 of NISSEI CO., LTD., current of 300 µA) for 3 minutes, 2 to 4 ml of the dispersion was collected and charged into the sample chamber of the above grain size analyzer containing 250 ml of deaerated water, and the suspension was circulated by activating the analyzer for 8 minutes to measure the grain size distribution of the suspension. The measurement was carried out a total of two times and the arithmetic mean value of 50% cumulative secondary particle diameters obtained from the measurements was calculated and taken as the average secondary particle diameter of the sample.

(2) BET Method Specific Surface Area of Magnesium Oxide Particle

This was measured by an adsorption method using liquid nitrogen.

(3) Flame Retardancy

This was measured in accordance with the UL 94 VE method.

(4) Water Absorption

A weight change was measured in a thermohygrostat (AGX-326 of Advantec Toyo Co., Ltd.) at 85° C. and 85% RH.

(5) Heat Conductivity

This was measured by a probe method using the QTM quick heat conductivity meter of Kyoto Denshi Kogyo Co., Ltd.

[I] Preparation of Magnesium Oxide Particle Samples (1) MgO Particles-a

Magnesium oxide particles having composition shown in I of Table 1 below (MgO content, Cl, Na, Mn and Fe contents), an average secondary particle diameter of 1.0 μm and a BET method specific surface area of 1.8 m²/g were mixed with 2.5 times (based on the mass) of water and dried at 105° C. for 2.5 hours to measure water absorption. The result is shown in Table 2.

(2) MgO Particles-b 100 kg of the above MgO particles-a (1) was injected into the Henschel mixer of Mitsui Miike Machinery Co., Ltd. and a solution prepared by dissolving 1 kg of stearyl acid phosphate in 20 l of ethanol at 60° C. was gradually added to the mixer under agitation, further stirred for 5 minutes and heated at 80° C. or more to remove the ethanol solvent so as to treat the surface of each particle. The water absorption of the magnesium oxide particles treated with stearyl acid phosphate was measured in the same manner as descried above. The result is shown in Table 2.

(3) MgO Particles-c

Magnesium oxide particles having composition shown in II of Table 1 below (MgO content, Cl, Na, Mn and Fe contents), an average secondary particle diameter of 20 μm and a BET method specific surface area of 0.4 m²/g were treated in the same manner as the above MgO particles-a (1) to measure water absorption thereof. The result is shown in Table 2.

(4) MgO Particles-d

The above MgO particles-c (3) were surface treated in the same manner as the above MgO particles-b (2) to measure water absorption thereof. The result is shown in Table 2.

(5) MgO Particles-e

The above MgO particles-a (1) were surface treated with 1% of vinyltriethoxysilane in the same manner as the above MgO particles-b (2) to measure water absorption thereof. The result is shown in Table 2.

(6) MgO Particles-f

The above MgO particles-c (3) were surface treated in the same manner as the above MgO particles-e to measure water absorption thereof. The result is shown in Table 2.

(7) MgO Particles-g

Magnesium oxide particles having composition shown in III of Table 1 below (MgO content, Cl, Na, Mn and Fe contents), an average secondary particle diameter of 1.0 μm and a BET method specific surface area of 1.6 m²/g were surface treated in the same manner as the above MgO particles-e.

(8) MgO Particles-h

Magnesium oxide particles having composition shown in IV of Table 1 below (MgO content, Cl, Na, Mn and Fe contents), an average secondary particle diameter of 25 μm and a BET method specific surface area of 0.2 m²/g were surface treated in the same manner as the above MgO particles-e.

TABLE 1

| composition | I (claimed invention) | II (claimed invention) | III (Comparative Example) | IV (Comparative Example) |
|---|---|---|---|---|
| MgO (%) | 99.29 | 99.21 | 99.35 | 98.8 |
| Cl (%) | 0.0015 | 0.0014 | 0.0018 | 0.0050 |
| Na (%) | 0.0004 | 0.0004 | 0.0004 | 0.0128 |
| Mn (%) | 0.0001> | 0.0001> | 0.0001> | 0.0001> |
| Fe (%) | 0.0012> | 0.0021> | 0.0193 | 0.095 |

TABLE 2

| type of particles | MgO particles-a | MgO particles-b | MgO particles-c | MgO particles-d | MgO particles-e | MgO particles-f |
|---|---|---|---|---|---|---|
| water absorption (%) | 1.21 | 0.29 | 0.90 | 0.01 | 0.21 | 0.18 |

[II] Preparation of Resin Composition (1) Examples A-1 to A-6 and Comparative Example 1

The magnesium oxide particles prepared in I above were mixed with an epoxy resin in a ratio below and the obtained composition was stirred and kneaded by sucking with a vacuum pump. Thereafter, the composition was poured into a stainless vat (8 cm×12 cm×3 cm) and pre-cured (110° C., 2 hours) and post-cured (150° C., 3 hours). The heat conductivity, water absorption and flame retardancy of the obtained molded product were measured and shown in Table 3.

In Comparative Example 1, the magnesium oxide particles were not mixed.

Mixing Condition epoxy resin (Epicoat 828, Yuka Shell Co., Ltd.) 100 parts
curing agent (Ricacid MH-700, Shin Nippon Rika Co., Ltd.) 80 parts
curing accelerator (BDMA, Koei Kagaku Co., Ltd.) 1 part
magnesium oxide particles 100 parts

TABLE 3

|  | C. Ex. 1 | Ex. A-1 | Ex. A-2 | Ex. A-3 | Ex. A-4 | Ex. A-5 | Ex. A-6 |
| --- | --- | --- | --- | --- | --- | --- | --- |
| epoxy resin | 100 | | | 100 | | | |
| curing agent | 80 | | | 80 | | | |
| curing accelerator | 1 | | | 1 | | | |
| magnesium oxide particles | — | | | 100 | | | |
| type of MgO particles | | a | b | c | d | e | f |
| heat conductivity (w/mK) | 0.181 | 0.404 | 0.354 | 0.507 | 0.480 | 0.360 | 0.475 |
| water absorption (%) | 0.65 | 0.56 | 0.48 | 0.45 | 0.44 | 0.49 | 0.44 |
| flame retardancy (UL94VE ⅛ inch) | below standards | V-0 | V-0 | V-0 | V-0 | V-0 | V-0 |

Ex.: Example
C. Ex.: Comparative Example (2) Examples B-1 to B-6

Molded products were obtained in the same manner as in Examples A-1 to A-6 except that the amount of the magnesium oxide particles was changed from 100 parts to 300 parts. The measurement results are shown in Table 4.

TABLE 4

|  | Ex. B-1 | Ex. B-2 | Ex. B-3 | Ex. B-4 | Ex. B-5 | Ex. B-6 |
| --- | --- | --- | --- | --- | --- | --- |
| epoxy resin | | | 100 | | | |
| curing agent | | | 80 | | | |
| curing accelerator | | | 1 | | | |
| magnesium oxide particles | | | 300 | | | |
| type of MgO particles | a | b | c | d | e | f |
| heat conductivity (w/mK) | 0.709 | 0.704 | 1.031 | 0.985 | 0.693 | 0.990 |
| water absorption (%) | 0.45 | 0.38 | 0.27 | 0.25 | 0.40 | 0.26 |
| flame retardancy (UL94VE ⅛ inch) | V-0 | V-0 | V-0 | V-0 | V-0 | V-0 |

Ex.: Example (3) Examples C-1 to C-6

Molded products were obtained in the same manner as in Examples A-1 to A-6 except that the amount of the magnesium oxide particles was changed from 100 parts to 600 parts. The measurement results are shown in Table 5.

TABLE 5

|  | Ex. C-1 | Ex. C-2 | Ex. C-3 | Ex. C-4 | Ex. C-5 | Ex. C-6 |
| --- | --- | --- | --- | --- | --- | --- |
| epoxy resin | | | 100 | | | |
| curing agent | | | 80 | | | |
| curing accelerator | | | 1 | | | |
| magnesium oxide particles | | | 600 | | | |
| type of MgO particles | a | b | c | d | e | f |
| heat conductivity (w/mK) | 1.209 | 1.207 | 1.569 | 1.420 | 1.201 | 1.410 |
| water absorption (%) | 0.39 | 0.28 | 0.18 | 0.17 | 0.30 | 0.18 |
| flame retardancy (UL94VE ⅛ inch) | V-0 | V-0 | V-0 | V-0 | V-0 | V-0 |

Ex.: Example

(4) Examples D-1 to D-6

Molded products were obtained in the same manner as in Examples A-1 to A-6 except that the amount of the magnesium oxide particles was changed from 100 parts to 1,400 parts. The measurement results are shown in Table 6.

(6) Example F

Magnesium oxide particles having an average particle diameter of 25.1 μm and magnesium oxide particles having an average particle diameter of 0.9 μm were mixed together

TABLE 6

|  | Ex. D-1 | Ex. D-2 | Ex. D-3 | Ex. D-4 | Ex. D-5 | Ex. D-6 |
|---|---|---|---|---|---|---|
| epoxy resin | 100 | | | | | |
| curing agent | 80 | | | | | |
| curing accelerator | 1 | | | | | |
| magnesium oxide particles | 1400 | | | | | |
| type of MgO particles | a | b | c | d | e | f |
| heat conductivity (w/mK) | 2.411 | 2.383 | 3.008 | 2.921 | 2.501 | 2.398 |
| water absorption (%) | 0.26 | 0.18 | 0.11 | 0.09 | 0.20 | 0.09 |
| flame retardancy (UL94VE ⅛ inch) | V-0 | V-0 | V-0 | V-0 | V-0 | V-0 |

Ex.: Example

(5) Example E

Magnesium oxide particles having an average particle diameter of 1.1 μm and magnesium oxide particles having an average particle diameter of 22.3 μm were mixed together in a ratio shown in Table 7 and surface treated in the same manner as the above MgO particles-e (5) of [I], and 250 parts by weight of the resulting mixture was mixed with 100 parts by weight of silicone oil. After they were mixed and stirred while they were vacuum defoamed, the viscosity of the obtained product was measured. The viscosity (cps) was measured with a No. 4 rotor at a revolution of 4 rpm using the B type viscometer of Toki Sangyo Co., Ltd. The heat conductivity of a molded product which was thermally cured by press crosslinking 150° C. for 30 minutes was measured. Table 7 shows the particle size distribution of the particles. The results are shown in Table 7.

in a weight ratio of 6:4 and surface treated in the same manner as the above MgO particle-e (5) of [I], and the resulting mixture was mixed with 100 parts by weight of silicone oil in an amount shown in Table 8. After they were mixed and stirred while they were vacuum defoamed, the viscosity of the obtained product was measured. The viscosity (cps) was measured with a No.4 rotor at a revolution of 4 rpm using the B type viscometer of Toki Sangyo Co., Ltd.

The heat conductivity of a molded product which was thermally cured by press crosslinking at 150° C. for 30 minutes was measured. The results are shown in Table 8.

TABLE 7

| mixing ratio (%) | average particle diameter of 1.1 μm | 100 | 60 | 50 | 40 | 30 | 20 | 0 |
|---|---|---|---|---|---|---|---|---|
| | average particle diameter of 22.3 μm | 0 | 40 | 50 | 60 | 70 | 80 | 100 |
| particle size distribution | 10 μm or more (wt %) | 1 | 37 | 49 | 57 | 66 | 76 | 93 |
| | less than 10 μm (wt %) | 99 | 63 | 51 | 43 | 34 | 24 | 7 |
| viscosity (cps) | | 20,000 | 12,000 | 13,000 | 10,000 | 12,000 | 14,000 | 20,000 |
| heat conductivity (w/mK) | | 1.385 | 1.367 | 1.327 | 1.302 | 1.262 | 1.136 | 1.057 |

TABLE 8

| amount (parts by weight) | 100 | 200 | 250 | 300 | 350 |
|---|---|---|---|---|---|
| viscosity (cps) | 1,800 | 5,500 | 28,000 | 68,700 | unmeasurable |
| heat conductivity (w/mK) | 0.523 | 1.077 | 1.331 | 1.606 | 1.829 |

(7) Example G 250 parts of each of magnesium oxide particles-e, f, g and h prepared in [I] above was mixed with 100 parts by weight of silicone oil and stirred while they were vacuum defoamed. The obtained product was thermally cured by press crosslinking at 150° C. for 30 minutes to produce a 2 mm thick molded product. The hardness, tensile strength and elongation of each molded product were measured in accordance with JIS-K6301 (vulcanized rubber physical test method) (basic physical properties). After each molded product was heated in a gear oven at 250° C. for 72 hours, hardness, tensile strength and elongation thereof were measured (thermal stability). The results are shown in Table 9.

TABLE 9

|  | Ex. G-1 | Ex. G-2 | C. Ex. G-3 | C. Ex. G-4 |
|---|---|---|---|---|
| silicone oil |  |  | 100 parts |  |
| magnesium oxide particles |  |  | 250 parts |  |
| type of MgO particles | e | f | g | h |
| basic physical properties |  |  |  |  |
| hardness (JIS-A) | 43 | 35 | 47 | 37 |
| tensile strength (kgf/cm$^2$) | 16 | 13 | 15 | 11 |
| elongation (%) | 70 | 70 | 60 | 70 |
| thermal stability (250° C. × 72 hours) |  |  |  |  |
| hardness (JIS-A) | 47 | 40 | 46 | 39 |
| tensile strength (kgf/cm$^2$) | 19 | 17 | 8 | 5 |
| elongation (%) | 65 | 60 | 95 | 100 |

Ex.: Example
C. Ex.: Comparative Example

Effect of the Invention

The present invention can provide a resin composition which has excellent flame retardancy, water resistance and heat conductivity and molded products formed therefrom. Since the resin composition of the present invention has excellent heat conductivity, it can be advantageously used as a heat radiation sheet for semiconductors.

Further, when the resin composition of the present invention is used to join various resin molded products (sheet and film molded products) or join a resin molded product and a metal, making use of excellent heat conductivity thereof, it shows an excellent effect in the removal or transmission of heat.

What is claimed is:

1. A resin composition comprising 100 parts by weight of a synthetic resin and 50 to 1,500 parts by weight of magnesium oxide particles, wherein
the magnesium oxide particles satisfy the following requirements (i) to (v):
(i) an average secondary particle diameter of 0.1 to 130 μm,
(ii) a BET method specific surface area of 0.1 to 5 m$^2$/g,
(iii) a total content of an Fe compound and an Mn compound of 0.01 wt % or less in terms of metals,
(iv) an Na content of 0.001 wt % or less, and
(v) a Cl content of 0.005 wt % or less.

2. The resin composition of claim 1, wherein the magnesium oxide particles are surface treated with at least one surface treating agent selected from the group consisting of a higher fatty acid, anionic surfactant, phosphate, coupling agent and fatty acid ester of a polyhydric alcohol.

3. The resin composition of claim 1, wherein the magnesium oxide particles are surface treated with at least one surface treating agent selected from the group consisting of a higher fatty acid, anionic surfactant, phosphate, coupling agent and fatty acid ester of a polyhydric alcohol and the surface treating agent is used in an amount of 0.001 to 10 wt % based on the magnesium oxide.

4. The resin composition of claim 1, wherein the magnesium oxide particles have an Na content of 0.0005 wt % or less and a Cl content of 0.002 wt % or less.

5. The synthetic resin composition of claim 1, wherein the magnesium oxide particles have a total content of an Fe compound and an Mn compound of 0.005 wt % or less in terms of metals.

6. The resin composition for sealing a semiconductor of claim 1 which further contains a curing agent in an amount of 50 to 200 parts by weight based on 100 parts by weight of the synthetic resin.

7. The resin composition for sealing a semiconductor of claim 1, wherein the synthetic resin is an epoxy resin, silicone resin, phenolic resin, diallyl phthalate resin, polyimide resin, polyphenylene sulfide resin, acrylic rubber, butyl rubber, ethylene propylene rubber, ethylene-vinyl acetate copolymer or ethylene-acrylate copolymer.

8. The resin composition for sealing a semiconductor of claim 7, wherein the silicone resin is silicon rubber.

9. The resin composition of claim 1, wherein the synthetic resin is an epoxy resin or silicone resin.

10. The resin composition of claim 1, wherein the magnesium oxide particles have a particle size distribution that particles having a particle diameter of 10 μm or more account for 30 to 80 wt % and particles having a particle diameter of less than 10 μm account for 20 to 70 wt % of the total.

11. The resin composition of claim 1, wherein the magnesium oxide particles are spherical.

12. A molded product formed from the resin composition of claim 1.

13. A molded product which is formed from the resin composition of claim 1, contains substantially no halogen and satisfies level V-O according to an UL 94 VE flame retardancy test.

14. A molded product which is formed from the resin composition of claim 1 and has a water absorption of 0.07 to 0.6 wt % and a heat conductivity of 0.35 to 3.2 W/mK.

15. A semiconductor element sealed by the resin composition of claim 1.

16. A heat generating electronic member placed upon a heat conductive sheet formed from the resin composition of claim 1.

17. An electronic member comprising a molded product formed from the resin composition of claim 1 arranged around a heat generating electronic member as a heat conductive material.

18. A filler for synthetic resin which is magnesium oxide particles satisfying the following requirements (i) to (v):
   (i) an average secondary particle diameter of 0.1 to 130 μm,
   (ii) a BET method specific surface area of 0.1 to 5 $m^2/g$,
   (iii) a total content of an Fe compound and an Mn compound of 0.01 wt % or less in terms of metals,
   (iv) an Na content of 0.001 wt % or less, and
   (v) a Cl content of 0.005 wt % or less.

19. The filler for synthetic resin of claim 18, wherein the magnesium oxide particles have an Na content of 0.0005 wt % or less and a Cl content of 0.002 wt % or less.

20. The filler for synthetic resin of claim 18, wherein the magnesium oxide particles have a total content of an Fe compound and an Mn compound of 0.005 wt % or less in terms of metals.

21. The filler for synthetic resin of claim 18, wherein the magnesium oxide particles are spherical.

* * * * *